(12) United States Patent
Randhawa et al.

(10) Patent No.: US 9,418,831 B2
(45) Date of Patent: Aug. 16, 2016

(54) METHOD FOR PRECISION CLEANING AND DRYING FLAT OBJECTS

(75) Inventors: Rubinder Randhawa, Dublin, CA (US); Basha Sajjad, Pleasanton, CA (US); Shmuel Erez, San Jose, CA (US); Harry Christov, Campbell, CA (US)

(73) Assignee: Planar Semiconductor, Inc., San Jose, CA (US)

( * ) Notice: Subject to any disclaimer, the term of this patent is extended or adjusted under 35 U.S.C. 154(b) by 0 days.

(21) Appl. No.: 11/881,703

(22) Filed: Jul. 30, 2007

(65) Prior Publication Data

US 2009/0032062 A1  Feb. 5, 2009

(51) Int. Cl.
| | |
|---|---|
| H01L 21/67 | (2006.01) |
| B08B 3/02 | (2006.01) |
| B08B 11/02 | (2006.01) |
| H01L 21/02 | (2006.01) |

(52) U.S. Cl.
CPC ............ *H01L 21/02052* (2013.01); *B08B 3/02* (2013.01); *B08B 11/02* (2013.01); *H01L 21/67028* (2013.01)

(58) Field of Classification Search
USPC .................. 134/2, 18, 23, 26, 32, 33, 42, 1.3; 438/906; 34/73, 78, 92, 329, 443, 467
See application file for complete search history.

(56) References Cited

U.S. PATENT DOCUMENTS

| | | | |
|---|---|---|---|
| 5,351,419 A | 10/1994 | Franka et al. | |
| 5,882,433 A * | 3/1999 | Ueno | H01L 21/67028 134/31 |
| 6,082,377 A * | 7/2000 | Frey | 134/6 |
| 6,784,106 B2 | 8/2004 | Bae et al. | |
| 6,837,944 B2 | 1/2005 | Kashkoush et al. | |
| 6,863,741 B2 * | 3/2005 | Orii et al. | 134/30 |
| 6,875,289 B2 | 4/2005 | Christenson et al. | |
| 6,901,685 B2 | 6/2005 | Yamaguchi et al. | |
| 6,918,192 B2 | 7/2005 | Yang | |
| 6,959,503 B2 | 11/2005 | Miranda et al. | |
| 7,021,319 B2 | 4/2006 | Verhaverbeke et al. | |
| 2002/0189643 A1 | 12/2002 | Chen et al. | |
| 2006/0174919 A1 * | 8/2006 | Randhawa | 134/34 |
| 2007/0004091 A1 * | 1/2007 | Tamagawa | H01L 23/433 438/122 |

OTHER PUBLICATIONS

Process Technology. Archived using the "Wayback Machine". 2002. http://web.archive.org/web/20021113045104/http://www.process-technology.com/processtechnol/hotdi.htm.*

* cited by examiner

*Primary Examiner* — Nicole Blan
(74) *Attorney, Agent, or Firm* — Schwegman Lundberg & Woessner, P.A.

(57) ABSTRACT

Cleaning and drying of semiconductor wafers is carried out in a single-chamber type cleaning/drying apparatus for flat objects such as semiconductor wafer, where cleaning is carried out by impinging both sides of the wafer which rotates at a relatively low speed with jets of a washing liquid and where subsequent drying is carried out in the same chamber by increasing the rotation speed of the wafer and supplying an isopropyl-alcohol (IPA) mist onto the wafer from the top of the chamber. After the IPA forms a solution with the residue of water on the wafer, the drying process is accelerated by supplying gaseous nitrogen through nozzles arranged on both side of the coaxial with the wafer center. As a result, the IPA-water solution quickly evaporates without leaving traces of water drops on the dried surface.

17 Claims, 8 Drawing Sheets

METHOD FOR PRECISION CLEANING AND DRYING FLAT OBJECTS

CROSS-REFERENCE TO RELATED APPLICATIONS

The present patent application is related to a co-pending patent application Ser. No. 11/881,691 filed by the same applicant on Jul. 30, 2007 and entitled: "A SINGLE-CHAMBER APPARATUS FOR PRECISION CLEANING AND DRYING FLAT OBJECTS".

FIELD OF THE INVENTION

The present invention relates to semiconductor manufacture, in particular to a method for precision cleaning and drying flat objects, such as semiconductor-wafer substrates. More specifically, the invention relates to a method of cleaning and drying semiconductor-wafer substrates in a single-chamber apparatus equipped with pulsed-jet cleaning nozzles for liquid cleaning and with means for formation and supply of a mist of isopropyl alcohol and a flow of gaseous nitrogen to an object for drying the latter.

DESCRIPTION OF THE PRIOR ART

Cleaning and drying of surfaces of wafer substrates is one of the most important steps in the fabrication of semiconductor microelectronic devices. It is well known that presence of chemical contaminants and particles of impurities may significantly reduce the yield of the products and noticeably affect the performance and reliability of the produced semiconductor devices.

In view of the present trend in the semiconductor industry that goes far beyond features of a device such as submicron sizes, effective techniques for cleaning silicon wafers, e.g., initially and after oxidation and patterning, are now more important than ever before because of the extreme sensitivity of semiconductor surfaces to the presence of contaminants. Specifically, total metallic impurities should be far less than $10^{10}$ atoms per $cm^2$. Presence of particles larger than 0.1 μm in size should be much less than approximately 0.1 per $cm^2$. This means that particles, e.g., on the 200 mm wafer, may be considered to be the threshold of cleanliness.

It should be further noted that contamination in the level of monolayers could drastically alter surface properties such as wettability, adhesion, or optical and electrical characteristics of a surface. Particles in the micron to submicron range trace contaminants such as non-volatile residues (NVR) in the range of micrograms/$cm^2$ and pictogram/$cm^2$ Ionics in the same range or traces of corrosion have become part of the daily concerns of the manufacturing engineers in major industries such as semiconductor, automotive, disk drive, optics, ophthalmic, glass, medical, aerospace, pharmaceuticals, and tool coatings, among others.

Therefore the choice of types of cleaning liquids used for wafer cleaning should be evaluated from the point of view of satisfaction of the above requirements in the treated wafers. To select an effective cleaning method, the three essential factors directly influencing cleaning results are the cleaning chemistry, the particle-removing method, and the process parameters.

There exists a plurality of various methods and processes for wafer cleaning that can be subdivided into dry-physical, wet-physical, combined wet-physical/chemical, vapor-phase methods, etc. Furthermore, there is a series of apparatus for implementing the aforementioned cleaning processes in the industry. A review of various cleaning apparatus is given in more detail in an earlier patent application of one of the present applicants (see US Patent Application Publication No. 20060174919, published on Aug. 10, 2006; inventor: R. Randhawa). The aforementioned patent application relates to an advanced wet-process cleaning method and apparatus for pulsed jet cleaning of flat objects based on the principle of enhancing formation of droplets of the cleaning medium by increasing the boundary surface area between the jets emitted though the nozzles of the cleaning unit and the surrounding atmosphere. In various embodiments of the invention, these droplet formation enhancement means are located inside the nozzle at the nozzle outlet end and are made in the form of a jet splitter, threaded grooves on the inner surface of the nozzle body, or in the form of a thin tube for the supply of gas into the flow of the liquid cleaning medium for the formation of gas bubbles in the medium. The method also takes into account such factors as mass ratio between the droplets and the contaminant particles, velocity of droplets, organization and sequence of jets that attack the surface of the wafer, and flows that wash-out the separated particles, etc.

It should be noted that the process of cleaning should be selected with reference to the state of the substrates since the substrate may be in a hydrophobic or hydrophilic state. Hydrophobic substrate is more difficult to clean than hydrophilic substrate because of its poor wettability with aqueous cleaning solutions. Normally, after various processes of chemical treatment, wafer substrates are cleaned with de-ionized water, the efficiency of which is very low. Drying of hydrophobic wafers is even more challenging than cleaning because of the high affinity of particle contaminants to hydrophobic surfaces. Furthermore, since pure de-ionized water is typically sprayed directly onto the hydrophobic surface during rinsing, watermarks and residue are commonly observed on hydrophobic surfaces after drying. These watermarks and residue may cause problems in subsequent use of the semiconductor wafers. Normally after wet cleaning, a substrate must be dried, and the drying should not introduce any secondary contamination such as aforementioned marks and residue. Known drying processes sometimes include the use of heated liquids or heated gases, such as heated nitrogen gas, during and after rinsing for the removal of unwanted droplets and films from the wafer surfaces.

Known in the art of cleaning and drying semiconductor wafers is the so-called Marangoni process, which comprises a wet-cleaning process resulting in a completely dried substrate because the substrate is gradually dried directly during extraction of the substrate from the cleaning liquid. More specifically, after the wafers are rinsed, e.g., by de-ionized water, the substrate is fed to an upper interior space of a rinsing bath, and the de-ionized water is slowly withdrawn into a space filled with gas or vapor. Filling the interior of the drying chamber with the vapor of isopropyl alcohol (hereinafter referred to as "IPA") can significantly enhance the drying process of the Marangoni process.

More specifically, use of IPA supplied within the gas environment, thus replacing the liquid environment, becomes very popular because IPA does not leave marks or residue on the cleaned and dried surfaces of the semiconductor substrates, and use of the Marangoni process becomes very popular because it drastically reduces the amount of de-ionized water needed for cleaning.

Given below is a short review of patent documents dedicated to cleaning and drying using IPA and the Marangoni process, as well as other specific methods of cleaning and drying.

For example, US Patent Application Publication No. 20020189643 published in 2002 (Inventor Y. Chen, et al.) discloses a method for cleaning and drying hydrophobic wafers. In the first aspect, the method cleans and dries wafers without applying pure de-ionized water (DI) to the wafer. In the second aspect, the method cleans a wafer by applying pure DI water to the wafer only for a short duration of time such that the DI water application ceases before or as soon as a surfactant solution is rinsed from the wafer; thereafter, the wafer is dried. In a further aspect, a hydrophobic wafer is wetted with a surfactant as it is transferred between cleaning apparatuses and is rinsed by means of a diluted surfactant or by means of a brief DI water spray and is thereafter dried.

U.S. Pat. No. 6,918,192 issued in 2005 to J. Yang describes a substrate drying system for drying substrates after the substrates are washed by typically using de-ionized water. This substrate drying system comprises a substrate-cleaning tank in which the substrates are washed. A dry pump is provided in fluid communication with the substrate-cleaning tank. A container that contains a supply of a liquid drying fluid, typically isopropyl alcohol (IPA), is further provided in fluid communication with the substrate-cleaning tank. In application, the dry pump induces reduced pressure inside the substrate-cleaning tank and the drying fluid container. This reduces vapor pressure, and thus, the boiling point of the drying fluid, such that the drying fluid vaporizes and remains in the vaporized state throughout transit to the substrate-cleaning tank and during drying of the substrate. Consequently, premature condensation of the drying fluid in the substrate-cleaning tank is prevented, eliminating formation of watermarks and deposits of particles, particularly in deep trenches formed in the substrate.

U.S. Pat. No. 7,021,319 issued in 2006 to S. Verhaverbeke, et al., describes assisted rinsing in a single wafer-cleaning process. The process is carried out in a single wafer-cleaning apparatus with horizontal arrangement of the wafer. After exposing a wafer to a cleaning and/or etching solution, the cleaning or etching solution is removed from the wafer by spinning the wafer and dispensing or spraying DI water onto the wafer as it is spun. The centrifugal force of the spinning wafer enhances rinsing of the wafer. In order to enhance rinsing of the wafer in the embodiment of the present invention, a solution having a lower surface tension than water, such as but not limited to isopropyl alcohol (IPA), is dispensed in liquid or vapor form onto the wafer after rinsing with DI water. In a specific embodiment of the present invention, the vapor of a solution with the lower surface tension than DI water, such as IPA vapor, is blown onto the wafer in order to break up the DI water that bulges up at the center of the spinning wafer. In another embodiment of the present invention, a gas, such N2, is blown for a short period of time onto the center of the wafer to break up the DI water that bulges up at the center of the spinning wafer. In yet another embodiment of the present invention, acoustic or sonic waves are applied to the wafer as it spins in order to help diffuse the DI water from the wafer. And in yet another embodiment of the present invention, DI water, which is dispensed onto the spinning wafer, is heated to a temperature above room temperature and preferably between 60 to 70° C. to enhance the diffusion of water from the wafer. The low surface-tension liquid, acoustic application, gas blowing, or heated DI water can be used alone or in combination in order to enhance rinsing of the wafer and thereby decreasing the rinsing time of the single wafer process to less than 20 seconds.

U.S. Pat. No. 6,959,503 issued in 2005 to H. Miranda, et al., describes an environmentally sound method for quickly removing liquid from the surface of a substrate during the manufacturing process without leaving substantial residue, e.g., aforementioned watermarks. The process includes first providing a substrate (e.g., a semiconductor wafer, glass flat panel, or disc media) that has undergone one or more liquid-based processes (e.g., cleaning, scrubbing, rinsing, etc.) The upper and lower surfaces of the substrate are then subjected to vacuum suction, thereby removing liquid thereon. An apparatus for removing liquid from the surfaces of a substrate is also provided. The apparatus includes a plurality of vacuum application members configured for applying vacuum suction to surfaces of a substrate, thereby removing liquid therefrom. The vacuum application member includes, for example, vacuum slots configured for disposition in proximity to the substrate surfaces and/or at least partially porous tubes configured for moving contact with the substrate surfaces. The apparatus can process one substrate at a time or remove liquid from multiple substrates simultaneously.

U.S. Pat. No. 6,951,221 issued in 2005 to S. Okuda, et al., describes a substrate processing apparatus that is provided with a gas-liquid mixing nozzle for generating a process-liquid mist by mixing a liquid and a pressurized gas in order to discharge the process-liquid mist to a substrate at high speeds. The liquid may be remover liquid, intermediate rinse liquid, or de-ionized water. The reaction products, which have been generated on the substrate during the etching process, are removed at high speeds with the flow of the mist, whereby the quality of the process is improved.

U.S. Pat. No. 6,901,685 issued in 2005 to K. Yamaguchi, et al, discloses an apparatus for drying the objects in a reduced period of time, effectively preventing contamination of the objects and preventing energy loss. The apparatus for carrying out the method of drying washed objects includes a drying tank having an opening on the upper portion thereof so that the washed objects can be placed or removed from above and a rinsing tank formed integrally with the drying tank and is capable of being sealed hermetically by closing a lid that can be opened or closed. The drying tank includes a mist-straightening vane for supplying organic solvent mist at normal temperatures to the washed objects so that the washed objects are dried by the organic solvent mist emitted from the mist-straightening vane.

U.S. Pat. No. 6,875,289 issued in 2005 to K. Christenson, et al., describes an immersion processing system for cleaning wafers with increased efficiency of chemical use. Such a system advantageously uses fewer cleaning enhancement substances, such as gas, vapor or liquid, directly to a meniscus or wafer/liquid/gas bath interface so as to effectively modify surface tensions at the meniscus with minimized chemical usage. Such a delivery system design may be applied for single-wafer processing or for processing multiple wafers together within a single liquid bath vessel. For single-wafer processing, in particular, a cleaning enhancement substance can be delivered along one or both major sides of the wafer, preferably at the meniscus that is formed as the wafer and liquid are relatively moved while the processing vessel used for such single wafer processing may, itself, be designed with a minimized size to accommodate a single wafer. By reducing the vessel volume, chemical usage for any processing chemicals that are to be provided within a liquid bath may also be advantageously reduced.

U.S. Pat. No. 6,863,741 issued in 2005 to T. Orii, et al., relates to a cleaning method and cleaning processing apparatus wherein a substrate, such as a semiconductor wafer, is subjected to a cleaning. A chemical agent, such as IPA or a solvent having a surfactant added thereto, is supplied in the form of a mist or a vapor toward the substrate which is stopped or rotated at low speed after processing with a chemical agent and subsequent rinsing processing with pure water. After the supply of the chemical agent is stopped, the substrate is rotated at a rotating speed higher than said low speed so as to centrifugally remove the chemical agent attached to the substrate.

U.S. Pat. No. 6,837,944 issued in 2005 to I. Kashkoush, et al., describes a method of cleaning semiconductor wafers before epitaxial deposition. The method comprises etching of silicon wafers with HF, rinsing the etched wafers with ozonated and ultrapure water, and drying the wafers with nitrogen and a trace amount of IPA.

U.S. Pat. No. 6,784,106 issued in 2004 to J. Bae, et al., relates to the drying of wafers in a stationary state by means of the Marangoni process. The method includes the steps of cleaning the substrate by supplying a liquid into a processing bath of a chamber, injecting dry gases onto a surface of the supplied liquid, draining the liquid from the processing bath so that the substrate is slowly exposed to the surface of the liquid, and injecting a second dry gas into the chamber and forcibly exhausting gas in the chamber.

When the IPA is supplied to the wafer from above, this creates non-uniform drying conditions. U.S. Pat. No. 5,351,419 issued in 1994 to J. Franka, et al., discloses a multidirectional flow of isopropyl alcohol vapor to uniformly dry a semiconductor substrate. In one embodiment, IPA, which is generated by an external vapor source, is injected into the vapor drying system at a location near the top portion of the semiconductor substrate, while internally generated isopropyl alcohol vapors are directed toward the bottom portion of the semiconductor substrate. Therefore, both the top and the bottom portions of the semiconductor substrate are dried at approximately the same time. However, this method of achieving uniformity in drying requires the use of complicated equipment with a double IPA-vapor formation system.

It has been shown that the known wafer-drying processes described above possess a number of advantages and disadvantages, but common drawbacks of the known methods and apparatuses are complicated structure, low efficiency, the use of separate cleaning and drying chambers or parts of chambers (Marangony), or large consumption of cleaning and drying chemicals.

OBJECTS AND SUMMARY OF THE INVENTION

It is an object of the present invention to provide a method for cleaning and sequentially drying a vertically oriented semiconductor wafer substrate to high precision in a single working chamber without changing the position of the substrate in transfer from cleaning to drying. It is another object to perform cleaning in a jet-pulse mode of emission of the cleaning liquid with rotation of the wafer substrate and to continue drying with substrate rotation and without interruption of rotation in transfer for drying. It is a further object to perform drying of a wafer substrate with the use of IPA. It is another object to provide the aforementioned method wherein the IPA is supplied in the form of a mist from the top of the wafer and supply of gaseous nitrogen is initiated after the IPA forms a solution with residue of water on the surface of the rotating wafer.

The method of the invention for cleaning and drying flat objects consists essentially of the following steps:

providing a single-chamber cleaning and drying apparatus comprising a working chamber that contains a rotary-type flat-object-holding means, a variable-speed driving mechanism for driving the rotary-type object-holding means; at least one nozzle array arranged opposite the surface of the flat object for the supply of a cleaning liquid under pressure to the surface of the flat object from a source of a cleaning liquid; exhaust duct for removal of liquid and gaseous products from the aforementioned working chamber; means for the formation and supply of a highly volatile liquid that is capable of forming a solution with water and that is supplied in the form of a mist from the top of the working chamber; a nozzle for the supply of a gaseous nitrogen to the central part of the rotating flat object; and a control system for controlling operation and synchronization of the aforementioned mechanisms;

preparing a cleaning liquid for cleaning, e.g., by adjusting the temperature, etc.;

loading a flat object into the working chamber and securing the flat object in the rotary-type flat-object-holding means;

initiating rotation of the flat object by activating the variable-speed driving mechanism which is rotated with a first speed;

initiating supply of the cleaning and cleaning the flat object by impinging the pressurized jets of the cleaning liquid onto the surface of the flat object which is rotated by the rotary-type object-holding means for the time T1, the cleaning process being accompanied by removal of waste liquid;

supplying the aforementioned highly volatile liquid to the top of the working chamber, forming a mist from the highly volatile liquid, and supplying the aforementioned mist to the surface of the flat object from the top of the working chamber;

accelerating rotation of the flat object to the second speed, which is higher than the aforementioned first speed;

forming a solution of the highly volatile liquid with residue of water left on the surface of the flat object after the cleaning cycle;

rotating the flat object with the second speed during time T2 until a homogenous layer of a the aforementioned solution is formed on the surface of the flat object;

supplying a neutral gas to the central part of the rotating object for interaction with uniform layer of the aforementioned solution and activating an exhaust of the fluids from the working chamber for displacement of the solution from the surface of the flat object with nitrogen;

continuing the supply of the neutral gas until complete dryness of the flat object; discontinuing rotation of the flat object; and releasing the flat object from the rotary-type flat-object-holding means and removing the dried flat object from the working chamber.

In the above-described method of the invention, the flat object may comprise a semiconductor wafer or a semiconductor wafer substrate that during treatment has a vertical orientation. Typically, the aforementioned highly volatile liquid is isopropyl alcohol and the neutral gas is nitrogen. The aforementioned steps are controlled, synchronized, and optimized by means of a central processing unit which is electrically connected to various executing mechanisms of the cleaning/drying apparatus.

For better understanding the method of the invention, it would be advantageous first to consider in detail the apparatus used to carry out the method. The apparatus is described in more detail in our co-pending patent application Ser. No. 11/881,691 filed on Jul. 30, 2007.

The apparatus of the invention has a closed casing that forms a sealed cleaning-drying chamber that contains a wafer holding and rotating mechanism formed by three circumferentially equally spaced wafer-driving rollers which are maintained in contact with the periphery of the wafer substrate and can be moved radially outward from the substrate edges for removal of the substrate after drying. A drive mechanism for the rollers is installed on the back side of the casing and comprises an adjustable-speed drive motor that rotates three drive gears through engagement with a tooth belt. The gears are attached to the rear ends of the inner shafts that pass into the cleaning-drying chamber of the apparatus and support the aforementioned wafer-driving rollers. Movement of the rollers toward the wafer edge and away from the wafer edge is carried out with the use of outer shafts into which the aforementioned inner shafts are rotatingly and eccentrically installed. The outer shafts can be turned in one or the other direction by an angle sufficient for releasing the substrate edges from the driving rollers or for bringing the roller in driving contact with the edges. This is achieved due to eccentricity of the inner shafts with respect to the outer shafts. The cleaning-drying chamber can be sealed and has a closable slot in a side wall for insertion and extraction of the wafer substrates with the use of a mechanical arm of a robot. Cleaning is carried out in a jet-pulse mode with the use of two nozzle arrays arranged on both side of the wafer and having a plurality of spray nozzles arranged in a radial direction of the wafer. The cleaning-liquid nozzles are connected to a source of DI water while centrally located nozzles are connected to a source of nitrogen that can be used to assist and accelerate drying and for uniform distribution of IPA over the surface of the rotating wafer. The apparatus is provided with two central nozzles for the supply of gaseous nitrogen to both sides of the wafer and with a shower head that supplies a mixture of IPA and nitrogen onto the wafer from above in the form of a mist that is effectively deposited onto the surface of the vertically arranged rotating wafer having residual water that has to be removed in the drying process.

DETAILED DESCRIPTION OF THE INVENTION

Figure 1:
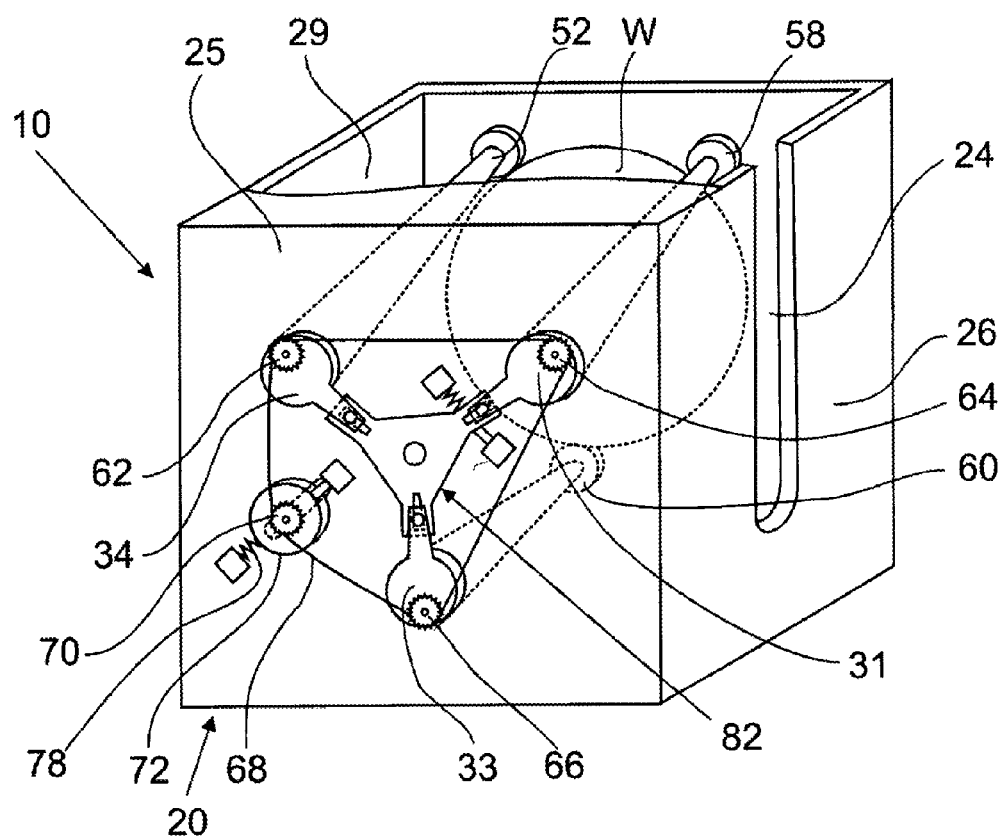
FIG. 1 is a simplified three-dimensional sectional view of a single-chamber apparatus of the present invention for precision cleaning and drying wafer substrates.
Figure 2:
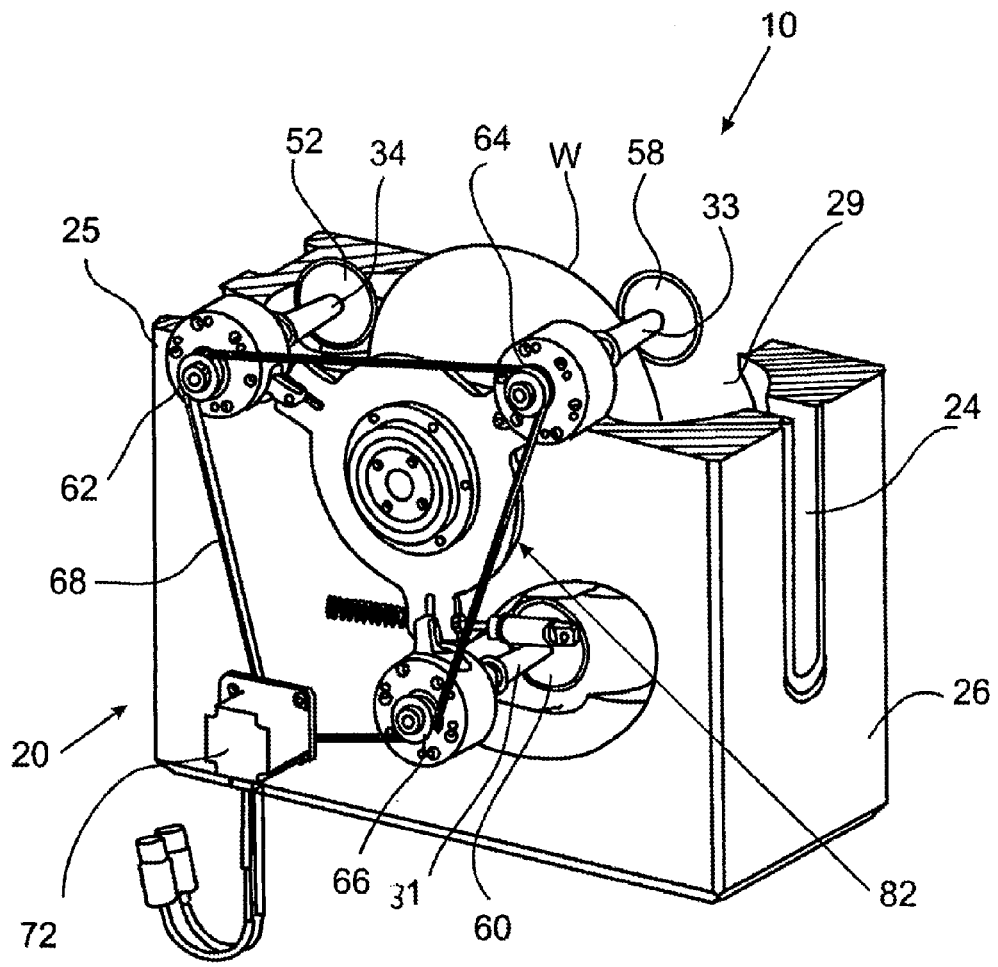
FIG. 2 is a three-dimensional view of the rear side of the apparatus with the shower head removed that illustrates the external and internal parts of the mechanism for rotating the wafer-driving rollers.

A simplified three-dimensional sectional view of a single-chamber apparatus of the present invention for precision cleaning and drying of flat objects, such as semiconductor substrates, is shown in FIG. 1. FIG. 2 is a three-dimensional view of the rear side of the apparatus with the showerhead removed, illustrating external and internal parts of the mechanism for rotating the wafer-driving rollers.

Although the invention relates more specifically to a mechanism and method for precision drying, it would be useful first to describe the single-chamber cleaning and drying apparatus of the invention as a whole with all the driving, loading, and unloading mechanisms, as well as other mechanisms and devices, which, in general, have been described in earlier pending U.S. patent application Ser. No. 11/881,691 and which are almost entirely incorporated into the apparatus of the present invention The apparatus, which as a whole is designated by reference numeral 10, is shown in FIG. 1 with a drying-fluid unit (which is described later) removed from the top of the apparatus for simplicity in the drawing. FIG. 1 is a simplified three-dimensional view of the apparatus 10, which shows the mechanical driving mechanisms of the apparatus. More specifically, the apparatus 10 contains a driving mechanism 20 of the invention for rotating wafer-driving rollers 52, 58, and 60. The mechanism 20 is either attached to or is formed on the rear wall 25 of a cleaning-drying chamber 29 (FIGS. 1 and 2) that has a through-closable slot 24 in its side wall 26 for insertion of a flat round object, e.g., a semiconductor wafer W, into the cleaning-drying chamber 29. A wafer W can be inserted into the cleaning-drying chamber 29 or removed therefrom in a conventional manner, e.g., by means of an end effector on the mechanical arm of an industrial robot (not shown), which can be inserted into a closable slot 24. A mechanism for closing the slot 24 is not shown.

The apparatus 10 shown in FIGS. 1 and 2 is intended for cleaning and drying semiconductor wafers or similar objects with vertical orientation of the latter.

The mechanism 20 for holding and driving semiconductor substrates, wafers, or the like, consists of three outer shafts 31, 33, and 34 circumferentially spaced from each other at equal distances (FIG. 2). Since all of these outer shafts are identical, only one of them, e.g., the outer shaft 34 will be described. The outer shaft 34 is rotatingly installed in the rear wall 25 of the drive mechanism or the cleaning chamber housing. The outer shaft 34 may be installed in sliding or roller bearings, or may, per se, have a sliding fit in the wall 25 or the chamber housing since rotation of this shaft is not critical and is needed only for slightly moving apart the contact rollers of the wafer drive mechanism, which is described below. The front end of the outer shaft 34 projects into the cleaning-drying chamber 29 and has a reduced diameter so that it does not occupy useful space of the cleaning-drying chamber 29. Furthermore, the parts of the outer shafts 31, 33, and 34 that project into the cleaning-drying chamber have smooth and streamlined surfaces.

As shown in FIG. 2, the outer shafts 31, 33, and 34 have through openings that are parallel to the axes of rotation of the outer shafts 31, 33, and 34 but are eccentrically offset therefrom for a certain distance. The outer shafts 31, 33, and 34 support inner shafts of smaller diameters (not seen in FIGS. 1 and 2), which are supported by ball bearings. Thus, the inner shafts are arranged eccentrically with respect to the axes of rotation of the outer shafts 31, 33, and 34. The front ends of the inner shafts that project into the cleaning-drying chamber 29 (FIGS. 1 and 2) rigidly support aforementioned wafer-driving rollers 52, 58, and 60.

The wafer-driving rollers are arranged circumferentially at equal distances from each other, and when a wafer W is inserted into the cleaning-drying chamber 29 or is removed from the cleaning-drying chamber 29, the rollers 52, 58, and 60 can be moved away from the wafer periphery.

On their rear ends, the inner shafts rigidly support gear wheels 62, 64, and 66, respectively, which engage an endless synchronous belt 68 that is guided over the gear wheels 62, 64, and 66 (FIG. 2). The mechanism also contains an additional gear wheel 70 (FIG. 1), which is attached to the output shaft of a rotary motor 72 and which also serves as a driving gear wheel for the synchronous belt 68 and, hence, for the gear wheels 62, 64, and 66 with their respective inner shafts and wafer-driving rollers 52, 58, and 60.

The device of the invention has a mechanism that constantly maintains the belt 68 in a tensioned state. For this purpose, a rear end of the rotary motor 72 is guided in a slot (not shown) in the rear wall 25 of the apparatus. The slot is arranged radially with respect to the belt so that when the rear end of the rotary motor 72 slides in the guide slot in the direction toward the inner shafts, the belt is tensioned. In fact, the synchronous belt 68 is constantly maintained in a stretched state, i.e., without loosening, since the additional gear wheel attached to the output shaft of the motor 72 constantly urges the belt 68 in the direction of tensioning under the effect of a compression spring 78 (FIG. 1) that pulls the motor 72 in the radial and outward direction of the belt 68.

The wafer-driving rollers 52, 58, and 60 may be in friction contact with the periphery of the wafer W, or, if the wafer has to be removed from the cleaning chamber 29, the contact rollers 52, 58, and 60 may be moved away from the periphery of the wafer W. This is achieved when the outer shafts 31, 33, and 34 are turned around their axes. Such movements toward and away from the edges of the wafer are performed by rotating the outer shafts 31, 33, and 34 by means of an eccentric shaft-turning mechanism 82, which is described in more detail in aforementioned U.S. patent application Ser. No. 11/881,691.

When the wafer W is held between the rollers 52, 58, and 60 that frictionally engage the wafer periphery, rotation of the rollers is positively transmitted to the wafer W by means of friction engagement with the rollers. The speed of the motor 72 can be adjusted so that it can be rotated slowly with a first speed (e.g., 60 to 80 rpm) during wet cleaning, or it can be rotated with a second speed that is one to twenty times higher than the first speed, e.g., 400 to 600 rpm, during drying. All above-described movements are synchronized and controlled by a computer (not shown), which is beyond the scope of the present invention.

Figure 3:
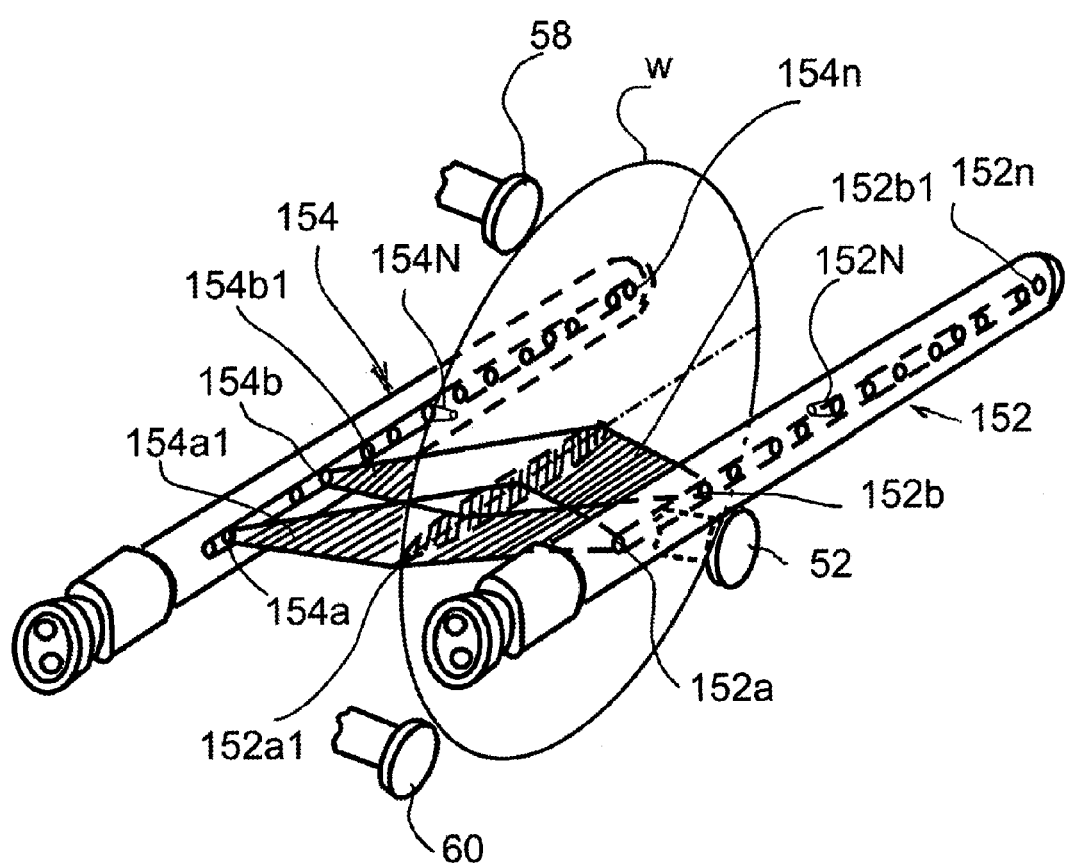
FIG. 3 is a three-dimensional view of nozzle arrays of the apparatus of the invention for pulse-jet cleaning and drying of the wafers.
Figure 4:
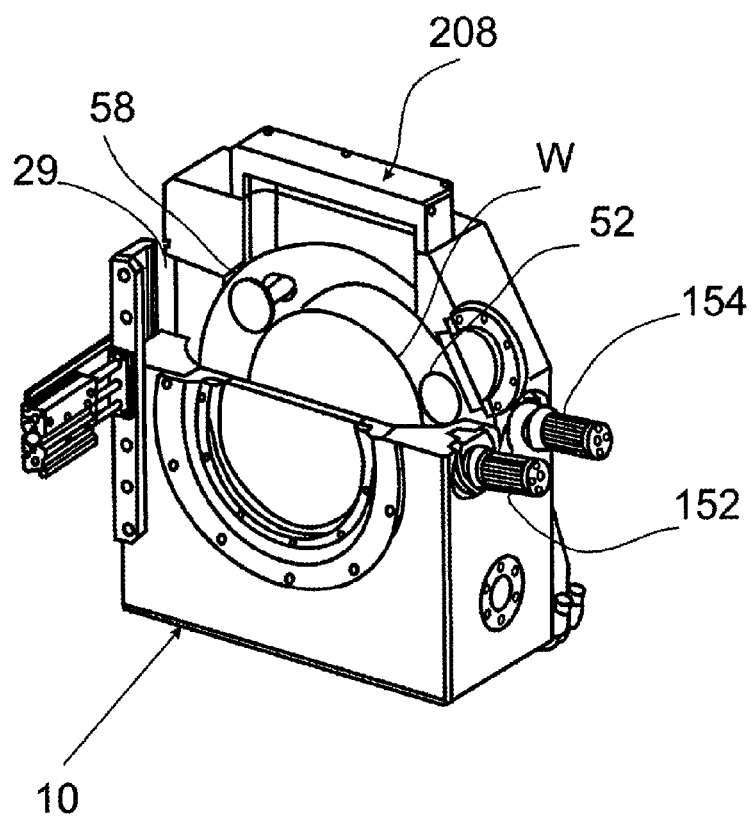
FIG. 4 is a view similar to FIG. 1 but showing some elements of the during medium supply system.

The chamber also contains stationary nozzle arrays 152 and 154, which are shown in FIG. 3, and the rear ends of which are shown in FIG. 4, which is a three-dimensional view of the apparatus 10. In FIG. 4, reference numeral 208 designates a drying medium supply system.

The stationary nozzle arrays 152 and 154 are positioned on both sides of the vertical wafer W diametrically across the wafer W to clean front and back surfaces of the wafer in a simultaneous process. In the illustrated embodiment, each of the nozzle arrays contains a plurality of nozzles. Thus, the nozzle array 152 contains nozzles 152a through 152n, while the nozzle array 154 contains nozzles 154a through 154n. The nozzles are intended for emitting a washing liquid, e.g., de-ionized water. Furthermore, each nozzle array 152 and 154 has a nozzle 152N and 154N, respectively, for supply of nitrogen substantially to the center of the rotating wafer W. The liquid-supply nozzles operate in so-called rapid-pulse harmonic spray mode described in U.S. patent application Ser. No. 11/299,134. In this mode, the nozzles inject discrete droplets of pulsed fluid streams of specific size selected to match a specific application.

The nozzles 152a through 152n and 154a through 154n use streams of discreet droplets of fluid (de-ionized water or another liquid) that are fired in rapid succession using a harmonic pulsed system (Rapid Pulse Clean system, RPC). Ultra-pure chemicals also can be sprayed in the chamber, depending on the cleaning step requirement. Acids as well as bases can be sprayed to clean the front and backside of a wafer. Planar Semiconductor's water-soluble PAD-series chemistries can also be sprayed for a variety of back-end and front-end wafer-cleaning applications. Planar's PAD-series chemistries offer an environmentally friendly alternative to the cleaning chemistries of RCA.

The jets 152a1 and 152b1, as well as the jets 154a1 and 154b1 (FIG. 3), are created by means of an electrical three-diaphragm short piston pump (not shown). Cleaning is carried out with the use of predetermined ultra-pure chemistries along with de-ionized-water rinsing of the wafer surface. Rapid-pulsed streams of chemistry and de-ionized water are fired in timed succession to clean and rinse the wafer surface, front and back, although it is not a requisite to clean the backside if not desired.

Until this point, the parts of the apparatus 10 described and shown in FIGS. 1 to 3 (except for the nitrogen-supplies nozzles 152N and 154N and the manifold 206 for the supply of the drying medium) were the same as those disclosed in the aforementioned patent application. A distinguishing feature of the apparatus 10 of the present invention is that drying of the wafer substrate after pulse jet cleaning with a cleaning liquid, e.g., DI water, is carried out in a dynamic mode, i.e., with rotation, in the same chamber as that in which cleaning was carried out without removal of the wafer substrate from the wafer-driving rollers 52, 58, and 60 but at a higher rotation speed than that during cleaning; drying is carried out with the use of a mixture of IPA and DI water with the supply of IPA (or a mixture thereof with nitrogen) through the same nozzles 152a to 152n and 154a to 154n (FIG. 3) used for the DI water. In fact, the aforementioned mixture of IPA and nitrogen comprises small droplets of IPA in a gaseous flow of nitrogen. When this "mixture" interacts with residual DI water on the surface of the wafer, an aqueous solution of IPA is formed. This solution possesses a number of properties, such as low viscosity, high volatility, etc. Provision of these properties facilitates removal of the aqueous solution of IPA from the surface of the wafer. This removal is facilitated by the supply of nitrogen through the central nozzles 152N and 154N (FIG. 3) that are fed to the surface of the wafer directly after the formation of the aforementioned aqueous solution of IPA. The time interval between the supply of the IPA-nitrogen "mixture" through nozzles 152a through 152n and 154a through 154n and initiation of the supply of nitrogen through the central nozzles 152N and 154N (FIG. 3) ranges from fractions of a second to several seconds. The supply of the drying media is accompanied by evacuation of the vapors that comprise a mixture of water with alcohol and nitrogen from the cleaning-drying chamber 29 (FIGS. 1, 2, and 4).

According to another embodiment, which is described in more detail below with reference to FIG. 5, the IPA-nitrogen "mixture" can be supplied from above through the drying-medium supply showerhead 208 located at the top of the chamber 29 along with the supply of nitrogen through the central nozzles.

It should be noted, however, that in both cases the drying stage can be initiated without stopping rotation of the wafer after discontinuing the supply of DI water. The drying process is accompanied by evacuation of the vapors from the cleaning-drying chamber, which constantly decreases the content of water and IPA while supply of nitrogen is continued. Since water is gradually removed, the process results in obtaining a completely dry wafer without any visible traces of water droplets.

Figure 5:
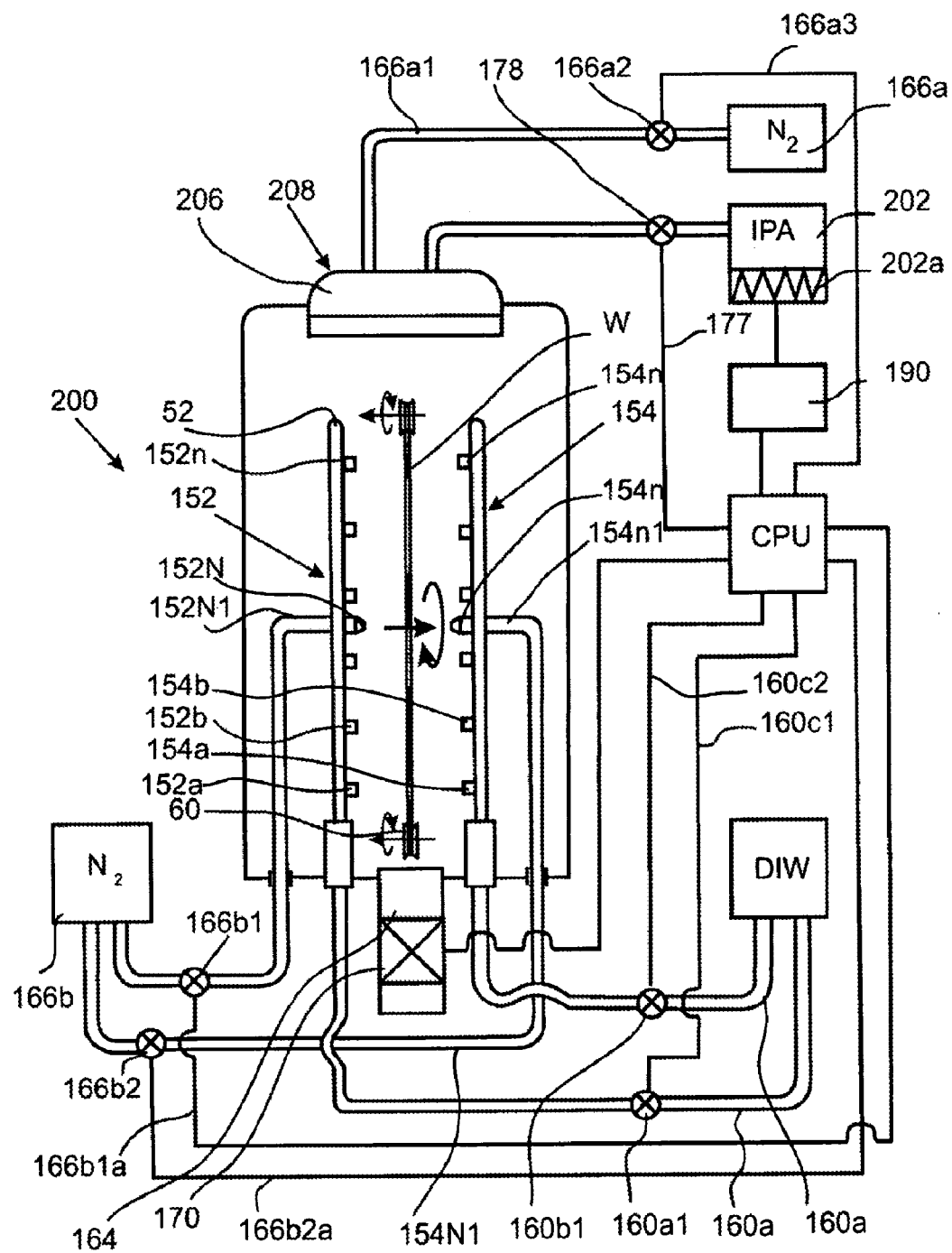
FIG. 5 is a schematic view of a cleaning and drying medium supply system of the apparatus of the invention.

As shown in FIG. 5, the apparatus of the invention is provided with a fluid distribution and supply system 200 used for cleaning and drying. The system consists of a reservoir 202 that contains a low-boiling-point liquid such as IPA, which is connected by means of a pipeline 204a or 204b (FIG. 5) with a manifold 206 of a showerhead 208 (FIGS. 4 and 5) that is located at the top of the cleaning-drying chamber 29 above the upper edge of the wafer W rotated by the driving rollers 2, 58, and 60, only two of which (52 and 60) are shown in FIGS. 4 and 5. Reference numeral 202a designates an IPA heater. The wafer W is located between the two nozzle arrays 152 and 154 (FIGS. 3 and 5).

A DI water source 162 is connected by branched pipes 160a and 160b to respective nozzle arrays 152 and 154. The pipes 160a and 160b contain respective shut-off valves 160a1 and 160b1 which are closed and opened for discontinuing or initiating the supply of DI water under control of a central processing unit (CPU) connected to the shut-off valves 160a1 and 160b1 by lines 160c1 and 160c2. The CPU is connected through a controller 190 to the IPA heater 202a and through a line 177 to a shut-off valve 178 installed in the pipeline 204a or 204b that connects the IPA reservoir 202 with the showerhead 208.

Reference numeral 166a designates a first source of gaseous nitrogen that provides a flow of nitrogen to the manifold 206 by means of pipeline 166a1, and reference numeral 166b designates a second source of gaseous nitrogen that supplies nitrogen to central nozzles 152N and 154N by means of pipelines 152N1 and 154N1, respectively. It is understood that the nitrogen sources 166a and 166b can be combined into a single nitrogen source and that the pipelines 152N1 and 154N1 can be guided to the valves 152N and 154N through the tubular housings of the nozzle arrays 152 and 154 together with the branched pipes 160a and 160b for the supply of DI water. Reference numeral 166a2 designates a shut-off valve installed in the pipeline 166a1 and connected to the CPU by means of a line 166a3.

Reference numerals 166b1 and 166b2 designate shut-off valves built into the respective pipelines 152N1 and 154N1. The shut-off valves 166b1 and 166b2 are controlled by the CPU via lines 166b1a and 166b2a. The bottom of the working chamber 29 has a drainage opening 164 that may be connected to a vacuum pump (not shown) through a shut-off valve 170.

Figure 6:
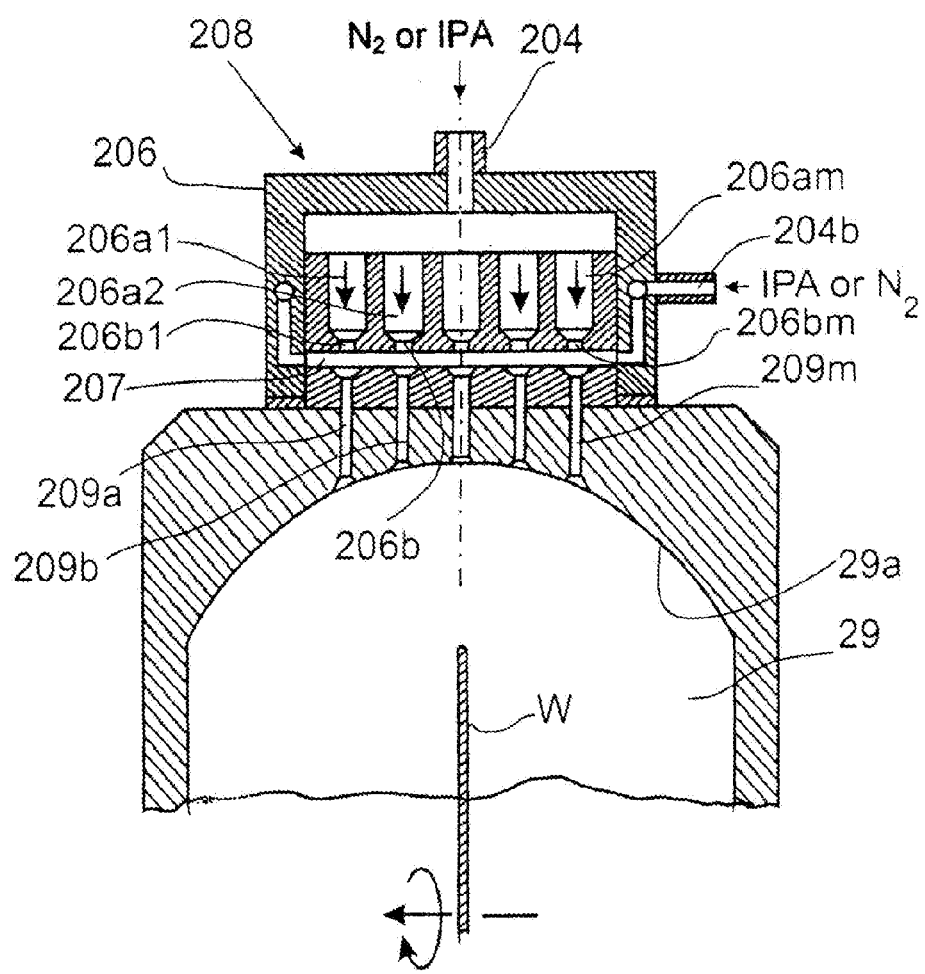
FIG. 6 is a vertical sectional view of a shower head of the apparatus of the invention.

FIG. 6 is a vertical sectional view that illustrates the structure of the showerhead 208. The showerhead 208 contains the aforementioned manifold (FIGS. 5 and 6) which has a common IPA collector chamber 206a connected from above to the IPA supply pipeline 204 and from below to a plurality of IPA supply channels 206a1 and 206a2 through 206am. In order to form a Bernoulli-type diffuser that facilitates suction of nitrogen into the jet flows of the IPA emitted through the exits of the IPA supply channels 206a1 and 206a2 through 206am, the exit ends of the aforementioned IPA supply channels 206a1 and 206a2 through 206am are converged to IPA exit nozzles 206b1 through 206bm. The aforementioned IPA exit nozzles 206b1 and 206b2 through 206bm are separated by a gap 207 from shower output channels 209a and 209b through 209m, which are coaxial with the IPA exit nozzles 206b1 and 206b2 through 206bm. The inputs of the shower output channels 209a and 209b through 209m are made in the form of converged funnels (not designated in FIG. 6). In fact, the IPA exit nozzles 206b1 and 206b2 through 206bm and shower output channels 209a and 209b through 209m form coaxial matrices of micro-diffusers that suck nitrogen into the flow of IPA and emit jets of IPA/$N_2$ in the form of a fog or mist into the chamber 29.

Figure 7A:
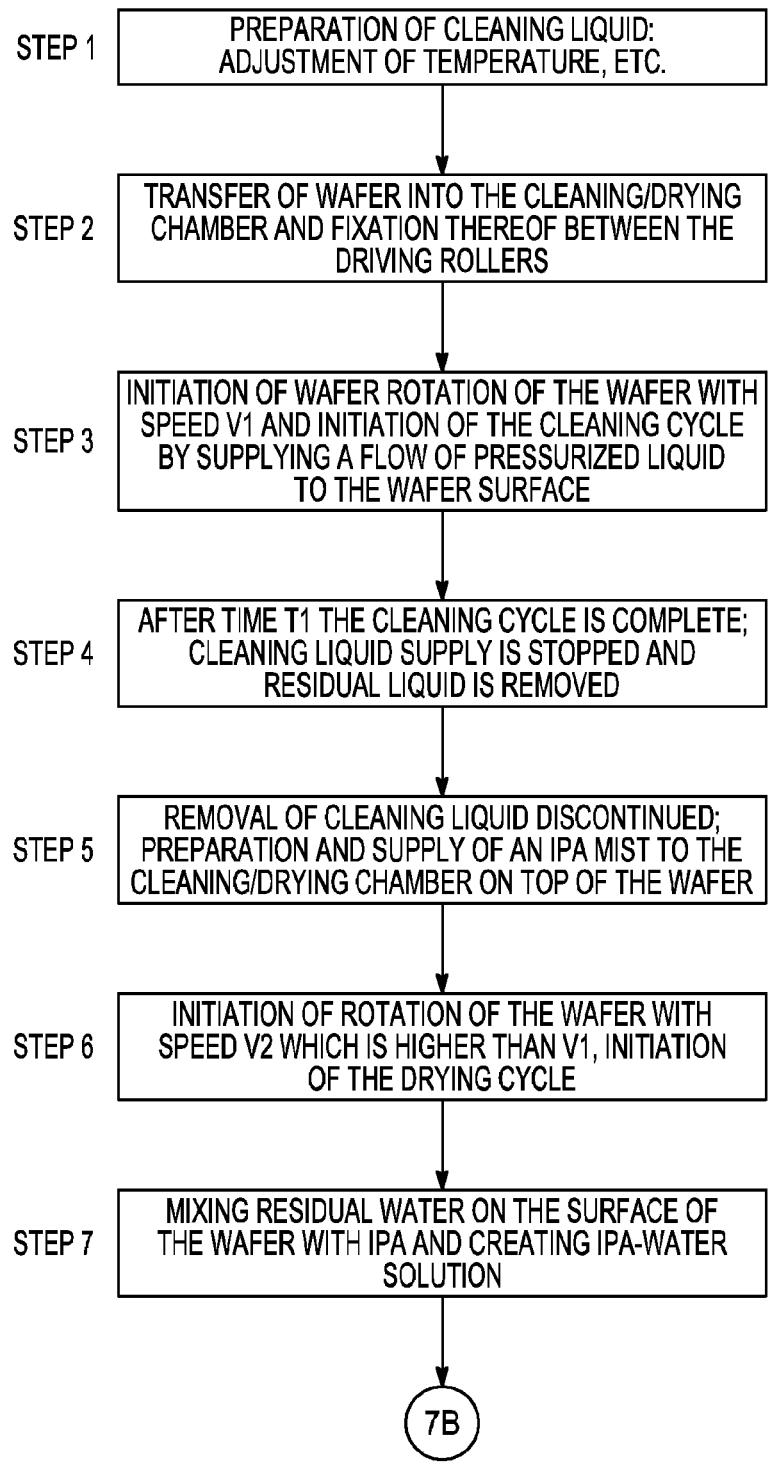
FIG. 7 is a flowchart of the method of the invention for cleaning and drying flat objects.
Figure 7B:
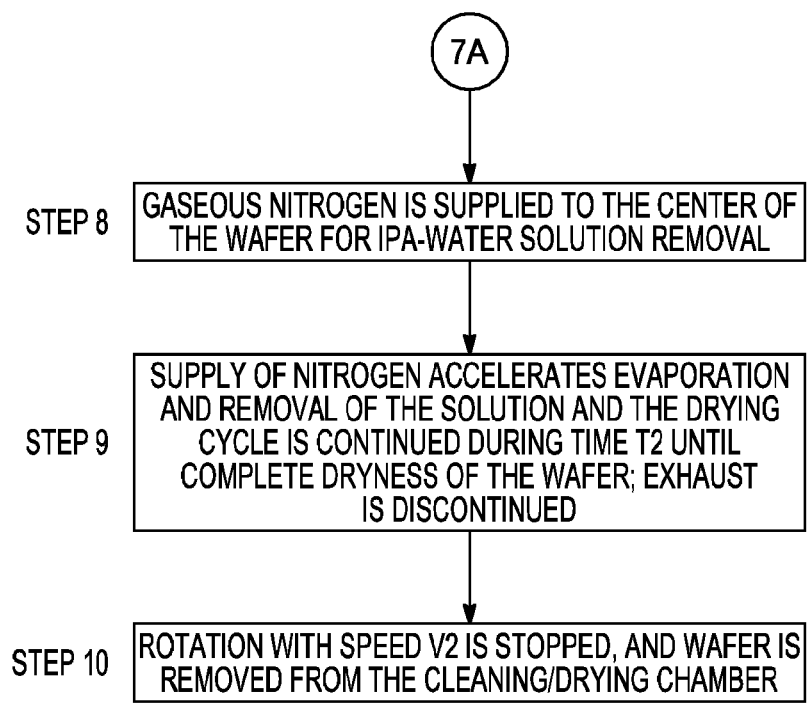

The method of the invention will now be described with reference to FIGS. 1 to 6 that illustrate the cleaning-drying apparatus 10 and to FIG. 7 which is a flowchart of a process for cleaning and drying a flat object, e.g., a semiconductor wafer W.

First, the cleaning liquid is adjusted to a required temperature t1 (Step 1). Temperature t1 may be in the range of 15° C. to a temperature below the boiling point of the cleaning liquid. In the case of deionized water, the temperature t1 may be adjusted in the range of 15° C. to 90° C.

A semiconductor wafer W is loaded into the working chamber 29 through a slot 24 in the side wall 26 of the cleaning-drying chamber 29 (FIG. 1). The wafer W is installed and secured between the rotating wafer-driving rollers 52, 58, and 60 (Step 2). The driving mechanism 20 (FIG. 1) is initiated and begins to rotate the semiconductor wafer W inside the cleaning chamber 29 due to contact with the rollers 52, 58, and 60 with the first speed that may be, e.g., in the range of 60 to 80 rpm (Step 3). In this step the jets of pressurized cleaning liquid, which normally is deionized water, are directed onto both sides of the wafer W from respective nozzle arrays 152 and 154 (FIG. 5). The cleaning cycle is continued during time T1, and after expiration of time T1 the cleaning cycle is completed, and the shut-off valve 170 (FIG. 5) in the bottom of the working chamber 29 is opened for removing the residual water from the working chamber 29 through the drainage opening 164. The temperature t2 of IPA is adjusted in the range of 15° C. to a temperature below the boiling point of the highly volatile liquid. In the case of IPA the temperature t2 may be adjusted in the range of 15° C. to 80° C., i.e., to a temperature below the boiling point of IPA, which is 82.5° C. Heating of the IPA is carried out with the use of the heater 202a. The preheated IPA supplied from the reservoir 202 and nitrogen supplied from the nitrogen source 166a to the shower head 208 form an IPA mist that is supplied from the top the of the working chamber 29 to the surface of the wafer W. Rotation of the wafer W from the drive mechanism 20 (FIG. 1) is accelerated to the second speed which is higher than the first speed and is in the range of 400 to 600 rpm (Step 6).

On the surface of the wafer W that rotates with the second speed, the residue of water is mixed with the IPA and forms an IPA-water solution (Step 7). Rotation with the second speed is continued until a homogenous layer of the aforementioned solution is formed on the surface of the wafer W. At this moment, gaseous nitrogen is supplied to the central parts on both sides of the wafer W (Step 8) from the nozzles 152N and 154N (FIG. 5) for interaction with the aforementioned solutions, and an exhaust system (not shown) is activated for removal of the fluids from the working chamber 29 through the opening 164 for displacement of the solution from the surface of the flat object with nitrogen. Supply of nitrogen is continued until complete dryness of the wafer W is achieved during time T2. Upon completion of the drying cycle, rotation of the wafer W is discontinued, and the wafer is removed from the working chamber 29 through the slot 24 in the wall 26 of the working chamber 29 (Step 10).

Thus, it has been shown that the present invention provides a method for cleaning and sequentially drying a vertically oriented semiconductor wafer substrate to high precision in a single working chamber without changing the position of the substrate in transfer from cleaning to drying. Cleaning is performed in a jet-pulse mode of emission of the cleaning liquid with rotation of the wafer substrate, and drying is continued with transfer to a higher speed without interruption of rotation. Drying is carried out with the use of IPA which is supplied in the form of a mist from the top of the wafer, and gaseous nitrogen is supplied to the center of the wafer after the IPA forms a solution with residue of water on the surface of the rotating wafer.

Although the invention has been shown and described with reference to specific embodiments, it is understood that these embodiments should not be construed as limiting the areas of application of the invention and that any changes and modifications are possible, provided that these changes and modifications do not depart from the scope of the attached patent claims. For example, the volatile liquids other than IPA and neutral gases other than nitrogen can be used for the drying process performed in the apparatus. The object may be stationary, and the head with nozzles may rotate relative to the object. Different pulse modes can be used and selected in accordance with specific operation conditions. The apparatus and method are applicable for cleaning not only flat objects but vertically-oriented objects of three-dimensional configurations, and the nozzles may be shifted axially for providing optimal distances to the areas to be cleaned. During cleaning and drying, the flat object can be rotated with more than two different speeds. The IPA can be directed onto the sides of the rotating wafer from the nozzles directed perpendicular to the flat surfaces of the wafer.

The invention claimed is:

1. A method for cleaning and drying a flat object, the method comprising:
   loading a flat object into a cleaning chamber and securing the flat object in a rotary-type flat-object-holding device;
   rotating the flat object substantially vertically with a variable-speed driving mechanism, the rotating being performed at a first rotational speed;
   cleaning the flat object by impinging a pressurized jet of a cleaning liquid onto a surface of the flat object for a time T1;
   supplying a mist formed from a volatile liquid to the surface of the flat object;
   accelerating rotation of the flat object to a second rotational speed greater than the first rotational speed;
   rotating the flat object at the second rotational speed for a time T2 until a substantially homogenous layer of a solution of the cleaning liquid and the volatile liquid is formed on the surface of the flat object;
   supplying a neutral gas supplied at least proximate to a central portion of the surface of the flat object to interact with the substantially homogenous layer of the solution;
   drying the flat object substantially vertically with a continuous supply of the neutral gas and rotation of the flat object at only the second rotational speed until substantial dryness of the flat object is achieved;
   discontinuing rotation of the flat object; and
   releasing the flat object from the rotary-type flat-object-holding device and removing the substantially dried flat object from the cleaning chamber.

2. The method of claim 1, wherein the flat object is a semiconductor wafer.

3. The method of claim 2, further comprising supplying the cleaning liquid in a pulse-jet mode.

4. The method of claim 1, wherein the volatile liquid is isopropyl alcohol and the neutral gas is nitrogen.

5. The method of claim 1, wherein the volatile liquid is isopropyl alcohol, and the neutral gas is nitrogen.

6. The method of claim 5, further comprising adjusting a temperature of the cleaning liquid in the cleaning chamber in a range of from about 15° C. to a temperature below a boiling point of the cleaning liquid.

7. The method of claim 6, wherein the first rotational speed is in a range of from about 60 rpm to about 80 rpm, and the second rotational speed is in a range of from about 400 rpm to about 600 rpm.

8. The method of claim 6, further comprising supplying the cleaning liquid in a pulse-jet mode.

9. The method of claim 5, wherein the first rotational speed is in a range of from about 60 rpm to about 80 rpm, and the second rotational speed is in a range of from about 400 rpm to about 600 rpm.

10. The method of claim 1, further comprising adjusting a temperature of the cleaning liquid in the cleaning chamber in a range of from about 15° C. to a temperature below a boiling point of the cleaning liquid.

11. The method of claim 1, further comprising adjusting a temperature of the volatile liquid in the cleaning chamber in a range of from about 15° C. to a temperature below a boiling point of the volatile liquid.

12. The method of claim 11, wherein the cleaning liquid is deionized water and the volatile liquid is isopropyl alcohol.

13. The method of claim 1, further comprising adjusting a temperature of the volatile liquid in the cleaning chamber in a range of from about 15° C. to a temperature below a boiling point of the volatile liquid.

14. The method of claim 13, wherein the cleaning liquid is deionized water and the volatile liquid is isopropyl alcohol.

15. The method of claim 1, wherein the first rotational speed is in a range of from about 60 rpm to about 80 rpm, and the second rotational speed is in a range of from about 400 rpm to about 600 rpm.

16. The method of claim 1, further comprising supplying the cleaning liquid in a pulse-jet mode.

17. A method for cleaning and drying a flat object, the method comprising:
   loading a flat object into a cleaning chamber and securing the flat object in a rotary-type flat-object-holding device;
   rotating the flat object substantially vertically with a variable-speed driving mechanism, the rotating being performed at a first rotational speed;
   cleaning the flat object by impinging a pressurized jet of a cleaning liquid onto a first surface and a second surfaces of the flat object for a time T1;
   supplying a mist formed from a volatile liquid to the first and second surfaces of the flat object;
   accelerating rotation of the flat object to a second rotational speed greater than the first rotational speed;
   rotating the flat object at the second rotational speed for a time T2 until a substantially homogenous layer of a solution of the cleaning liquid and the volatile liquid is formed on the first and second surfaces of the flat object;
   supplying nitrogen at least proximate to a central portion of each of the first and the second surface of the flat object to interact with the substantially homogenous layer of the solution;
   drying the flat object substantially vertically with a continuous supply of neutral gas and rotation of the flat object at only the second rotational speed until substantial dryness of the flat object is achieved;
   evacuating vapors resulting from interactions between the nitrogen and the substantially homogenous layer of the solution from the cleaning chamber;
   discontinuing rotation of the flat object; and
   releasing the flat object from the rotary-type flat-object-holding device and removing the substantially dried flat object from the cleaning chamber.

* * * * *